United States Patent [19]

Barton

[11] 3,961,101

[45] June 1, 1976

[54] PROCESS FOR IMPROVED DEVELOPMENT OF ELECTRON-BEAM-SENSITIVE RESIST FILMS

[75] Inventor: Lucian Anthony Barton, Trenton, N.J.

[73] Assignee: RCA Corporation, New York, N.Y.

[22] Filed: Sept. 16, 1974

[21] Appl. No.: 506,444

[52] U.S. Cl. .................................. 427/43; 96/35; 96/36; 96/49; 96/91 D; 156/13; 156/17; 427/335

[51] Int. Cl.² .................. B05D 3/06; G03F 1/02

[58] Field of Search ............. 96/49, 35.1, 91 D, 36, 96/36.1, 36.2, 36.3, 33, 35; 156/13, 17; 427/43, 335; 346/74 E, 74 CR

[56] References Cited
UNITED STATES PATENTS

| | | | |
|---|---|---|---|
| 3,264,104 | 8/1966 | Reichel | 96/91 D X |
| 3,482,973 | 12/1969 | Amidon | 96/36 X |
| 3,615,476 | 10/1971 | Cassieus et al. | 96/35.1 X |
| 3,615,486 | 10/1971 | Delzenne | 96/35.1 X |
| 3,639,185 | 2/1972 | Colom et al. | 96/36.2 X |
| 3,647,443 | 3/1972 | Rauner et al. | 96/91 D X |
| 3,649,393 | 3/1972 | Hatzakis | 156/13 X |
| 3,674,591 | 7/1972 | Boyd | 96/35.1 X |
| 3,707,373 | 12/1972 | Martinson et al. | 96/35.1 |
| 3,759,711 | 9/1973 | Rauner et al. | 96/91 D X |
| 3,770,433 | 11/1973 | Bartelt et al. | 96/35.1 X |
| 3,852,771 | 12/1974 | Ross et al. | 96/91 D X |
| 3,859,099 | 1/1975 | Petropoulos et al. | 96/91 D X |

*Primary Examiner*—Charles L. Bowers, Jr.
*Attorney, Agent, or Firm*—Glenn H. Bruestle; Birgit E. Morris

[57] ABSTRACT

The development of an exposed electron beam sensitive resist film in a two-stage process, rather than in a single stage, with a water wash between stages, improves the sensitivity and resolution that can be achieved for the resist.

2 Claims, 7 Drawing Figures

PROCESS FOR IMPROVED DEVELOPMENT OF ELECTRON-BEAM-SENSITIVE RESIST FILMS

This invention relates to an improved process for developing exposed electron beam sensitive resist films to provide a surface relief pattern in the resist film with increased sensitivity and resolution.

CROSS REFERENCE TO RELATED APPLICATIONS

This application discloses subject matter that is similar to copending application of Harris and Johnston, "Improved Method for Developing Resist Films" Ser. No. 506,445 filed concurrently herewith.

BACKGROUND OF THE INVENTION

Films of organic materials, commonly referred to as photoresists, are recording media on which information can be recorded in the form of a relief pattern. Such media, when exposed to a light pattern, change their solubility characteristics in those areas struck by the light. Films of photoresists are developed by contacting them after exposure in a controlled manner with a developer solution which is a solvent that dissolves the more soluble portions of the films, leaving the less soluble portions in a relief pattern which corresponds to the information contained in the light pattern. Negative photoresists are initially soluble in the developer solution and exposed portions become insolubilized. Positive photoresists are initially insoluble and become more soluble in the developer solution in the exposed portions.

Suitably modulated electron beams have also been utilized for recording relief patterns. Electron beams, by virtue of their shorter effective wavelength and greater depth of focus, can record information at higher resolution or density than can light beams. This ability is highly useful in the fabrication of integrated circuitry having very small circuit elements employing processes using electron beam sensitive materials and conventional photoresist processing techniques. Positive electron beam sensitive materials are also useful in serial information recording whereby individual signal elements are formed as minute, well-defined depressions in the surface of the electron beam sensitive material.

Formulations such as naphthoquinone diazide sulfonic acid esters admixed with an alkali soluble resin have long been utilized as positive photoresists in the lithographic art. These formulations form resist films which, after exposure to light or electron beams, are developed by contacting the films with appropriate aqueous alkaline solutions. Formulations of this type employing certain preferred naphthoquinone diazides admixed with an alkali soluble resin have also been found to be particularly useful as electron beam resists. One particular compound, 2,4-bis(6-diazo-5,6-dihydro-5-oxo-1-naphthalenesulfonyloxy)benzophenone, admixed with an alkali soluble resin in certain proportions, e.g. to contain from about 1 to about 50% by weight of the above compound, produces a formulation found to be particularly sensitive to electron beams, as is disclosed in copending application of Ross and Barton, Ser. No. 332,025, filed Feb. 12, 1973 now U.S. Pat. No. 3,852,771, issued Dec. 3, 1974, herein incorporated by reference.

Currently known electron beam sensitive formulations vary considerably in their sensitivity and resolution capabilities which in turn limits the density of recorded information obtainable. Accordingly, means for improving the sensitivity and resolution of electron beam recording media would be highly desirable.

SUMMARY OF THE INVENTION

I have discovered that the sensitivity and resolution capability of certain electron beam sensitive resist films that are developable by using aqueous, preferably alkaline, solutions, can be improved by interrupting the development process and interposing a water washing step in the development cycle. Thus, the process herein comprises contacting the exposed electron beam sensitive resist film to the developer solution for less than the optimum development time, washing the partially developed resist film with water, drying the film to remove the water and contacting the partially developed, washed resist film with the developer solution again to fully develop the resist film and form a relief pattern. Preferentially, after washing with water the partially developed resist film surface is dried in air.

DETAILED DESCRIPTION OF THE INVENTION

Figure 1:
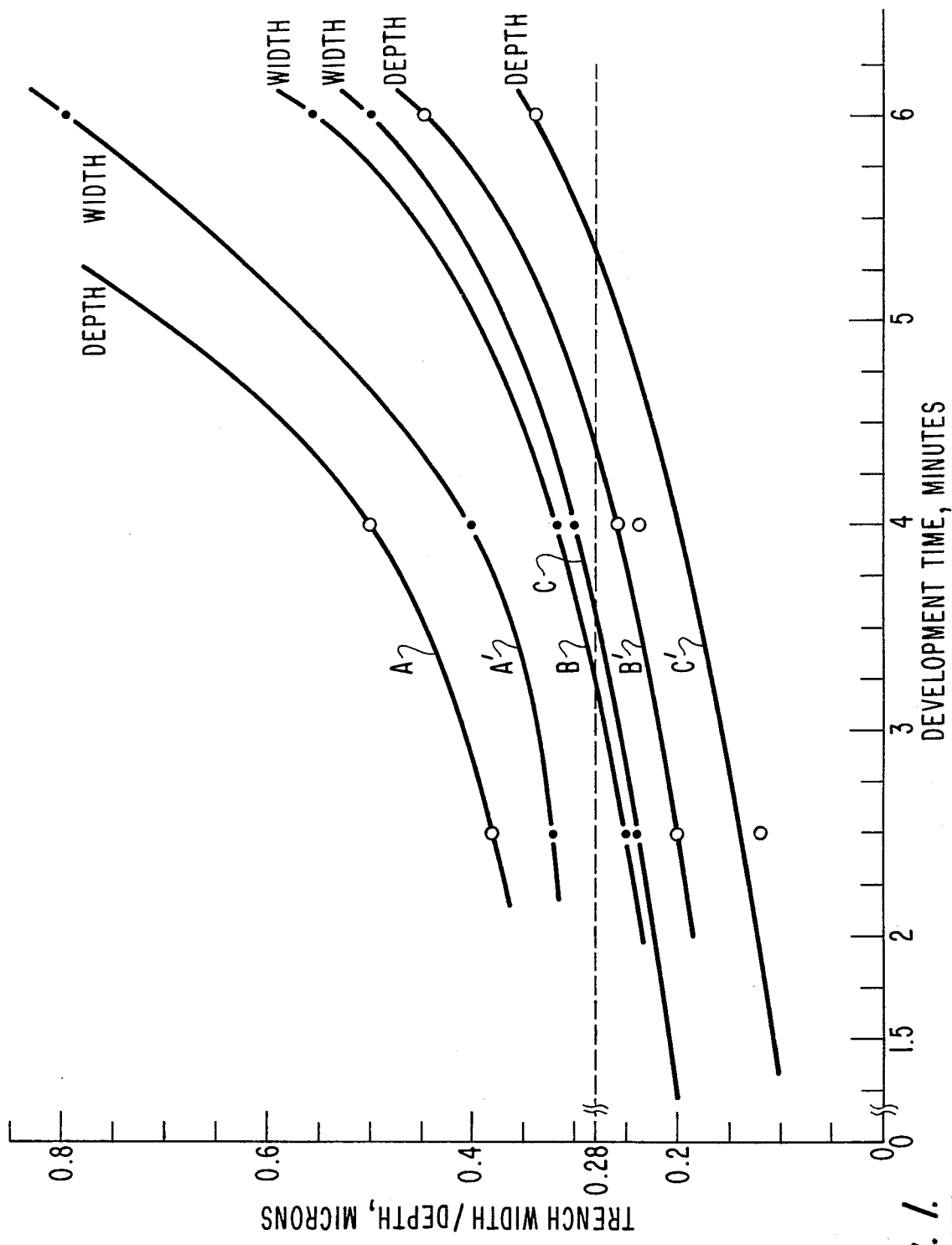
FIG. 1 is a graph of depth and width as a function of development time for trench patterns produced by development in a known single step process for various electron beam exposures.

According to the present process, a suitable positive electron beam resist film is exposed to a modulated electron beam. The resist film is then developed by contacting with an aqueous, alkaline developer solution, interrupting the development by washing the film with water, drying it, and completing the development. This process decreases the exposure time otherwise required to record the information in the form of a relief pattern of a given depth, e.g., a scanning electron beam can be utilized at greater scanning speeds. Resolution, as defined hereinafter, is increased, thereby allowing resolution of smaller signal elements and permitting increased information density to be recorded.

As herein defined, the sensitivity of an electron beam resist film to a scanning electron beam is related to the scanning speed or exposure required to produce a trench geometry where width divided by depth is less than or up to 1, where the width is equal to the width at half height of the Gaussian-shaped beam.

The resolution is related to the ratio of the relief patterns recorded with an electron beam of a given width and is determined by dividing the trench width in microns by the recording wavelength. Thus as this ratio decreases, the resolution increases.

The effective sensitivity of a positive electron beam resist film is measured as the net depth of the relief pattern produced after development, for a given amount of electron beam exposure. It will be recognized by those skilled in this art, that with the types of positive recording media described herein, even unexposed areas of the resist film have a definite, although low, solubility in the developer solutions employed. Thus, the net relief obtained on exposure and development is a function of the difference in solubility between the exposed and unexposed regions of the resist film.

The electron beam resist developers are conventional and well known. Formulations based on naphthoquinone(1,2-) diazide sulfonic acid esters admixed with alkali soluble resins can be developed with alkaline solutions, such as sodium hydroxide or sodium phosphate solutions, and these are commercially available. The improved results in the present multistage development are obtained independently of the nature of concentration of the developer solution. The optimum type and concentration of developer solution for each electron beam resist can be readily determined by one skilled in the art by a series of test runs.

The invention will be further illustrated by the following example but it is to be understood that the invention is not meant to be limited to the details described therein.

In the example, the electron beam sensitive resist employed was prepared as follows:

A solution containing 16 parts of 2,4-dihydroxybenzophenone in 500 parts by volume of pyridine was prepared and 44.15 parts of 2-diazo-1-naphthol-5-sulfonyl chloride were stirred in. The resulting solution was allowed to stand for 72 hours and poured slowly in a thin stream into a well-stirred mixture containing 2260 parts of ice water and 540 parts of concentrated hydrochloric acid. A finely divided precipitate formed which was collected by filtration, washed thoroughly with water and dried under vacuum. A yield of 49.46 parts of dry solid product was obtained.

The crude product obtained above was purified as follows: in a Waring Blender, 16.5 parts of the dry solid product were stirred with 420 parts by volume of benzene for thirty minutes and filtered. The insoluble residue was combined with residues (2.15 parts) obtained from similar extractions of two other similar portions of crude product. The combined residues were stirred for thirty minutes with 250 parts by volume of benzene and filtered. The remaining residue was washed with 20 parts by volume of benzene. The combined benzene solutions (690 parts by volume) were diluted with 700 parts by volume of cyclohexane while stirring vigorously. A yellow precipitate formed which was collected by filtration, washed with cyclohexane and dried under vacuum. A yield of 14.24 parts of the reprecipitated product was obtained.

Reprecipitated product (40.66 parts) prepared as above was recrystallized from 660 parts by volume of acetonitrile. The resultant crystalline product was reduced to a powder and dried under vacuum. A yield of 33.24 parts was obtained. The dried, recrystallized product had a melting point of 120°–122°C. (with decomposition).

A solution was prepared by dissolving 8.5 parts of a cresol-formaldehyde novolak resin commercially available as Alnovol 429-K from Chemische Werke Albert of Wiesbaden-Biebrich, Germany and 1.5 parts of the recrystallized ester prepared as above in 47 parts of methylcellosolve acetate.

EXAMPLE 1

Part A

Films 1.8 microns thick of the electron beam sensitive resist prepared as above were deposited by spinning the solutions onto glass plates coated with a thin chromium-nickel alloy. The glass plates were cut into slides ½ inch × ½ inch × 1/32 inch, baked at 50°C. for one hour and given line exposures to the beam of a scanning electron microscope at an accelerating potential of 10 keV and a beam current of 3nA. The Gaussian-shaped beam, having a width at ½ amplitude of 0.28 micron, was scanned to describe fine raster patterns at several speeds of 20, 32 and 40 cm/sec., thereby varying the total exposure of the films to the beam.

Samples of films as prepared above were developed in conventional manner by immersing them in undiluted Shipley AZ 1350 developer from the Shipley Co. at 21°C. for various periods, herein 2.5, 4.0 and 6.0 minutes.

Other samples were developed in the same developer by a two-stage process, immersing them in the developer for various periods of time, removing them, washing in a stream of distilled water, air drying, and after 3 minutes, immersing in the developer again.

After washing the developed films in water and air drying, a layer of gold 200 A thick was evaporated onto the films which were then examined using a scanning electron microscope. The width and depth of the raster line of each exposure were measured.

The achievable resolution and edge acuity are also of interest. This is measured by comparing the electron beam exposure required to produce depressions or trenches having a width to depth ratio equal to or less than one where the width is a constant, herein 0.28 micron.

The measured width and depth in microns of each exposure was plotted as a function of development time in minutes. FIG. 1 is a graph from a one-step development process wherein curves A and A' are the depth and width respectively for a 20 cm/sec. exposure to the electron beam, curves B and B' are the depth and width respectively for a 32 cm/sec. exposure and curves C and C' are the depth and width respectively for a 40 cm/sec. exposure. The condition $W/D \leq 1$ where the width is 0.28 micron was satisfied for the 20 cm/sec. scanning speed.

Figure 2:
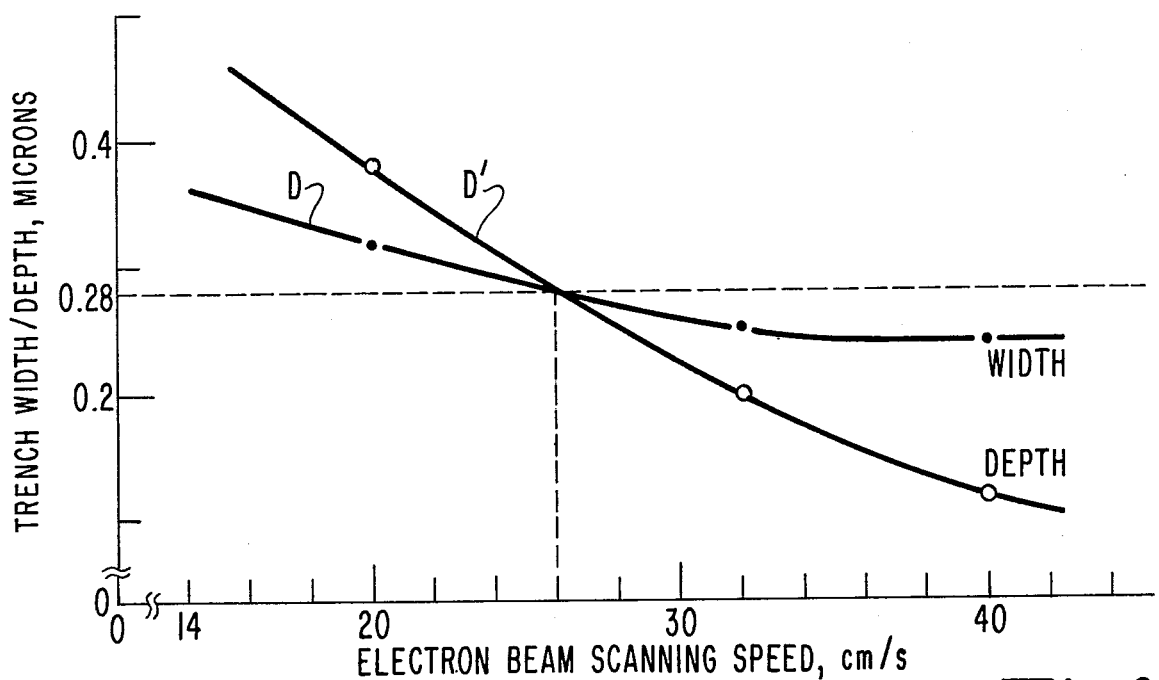
FIG. 2 is a graph of trench depth and width as a function of electron beam scanning speed developed in a known single step process for a given development time.

FIG. 2 is a graph of trench width (curve D) and depth (curve D') as a function of the electron beam scanning speed at 2.5 minutes development time for the one-step development. The lines intersect at 26 cm/sec. Thus the sensitivity required to produce a trench geometry $W/D \leq 1$ at 0.28 micron width is 26 cm/sec. This is equivalent to a calculated electron beam exposure of $3.8 \times 10^{-6}$ coulomb/cm$^2$.

Figure 3:
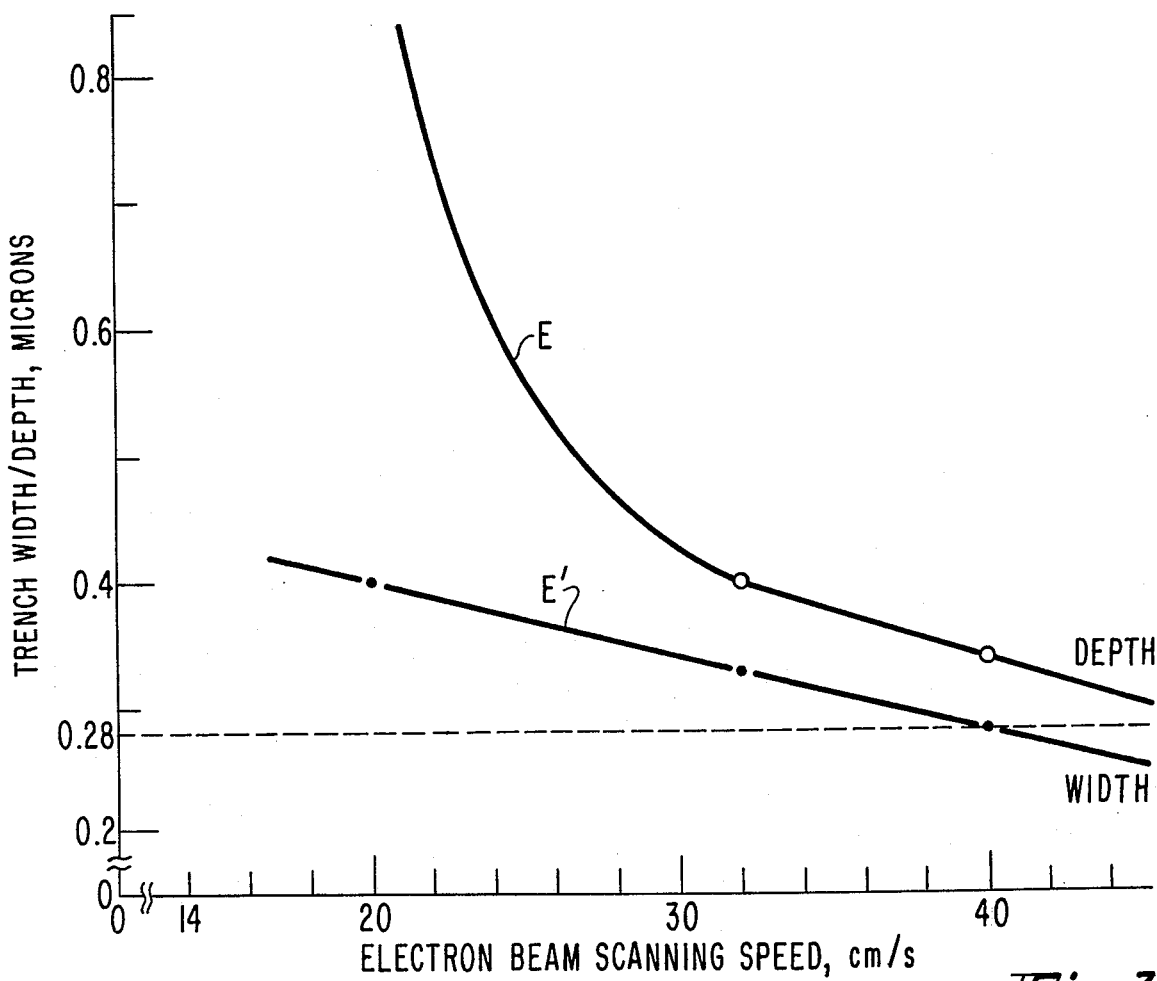
FIG. 3 is a graph of trench depth and width as a function of electron beam scanning speed produced by development in a novel two-step process.

FIG. 3 is a graph of trench depth and width as a function of electron beam scanning speed for a two-step development process wherein the development was for 2.5 minutes for the first immersion and 3.5 minutes for the second immersion. Curve E is the depth and curve E' the width, respectively, provided by the various exposures. The sensitivity required to satisfy the requirement of $W/D \leq 1$ at a width of 0.28 micron was 40 cm/sec. This corresponds to a calculated exposure of only $2.5 \times 10^{-6}$ coulombs/cm$^2$.

Thus if the relative sensitivity of the one-step development process is taken as 1, that of the two-step development process is 1.54, or an increase of 54% in the effective sensitivity of the resist.

Part B

Electron beam sensitive resist resolution, expressed as the ratio of trench width ($\geq$ 0.3 micron) to recording wavelength, relates to the width and edge acuity of the recorded information, and was compared for single and double stage development as follows:

A metal disc ½ inch thick and 14 inches in diameter having a 6 micron wide spiral groove with a 4000 grooves per inch pitch was coated with a 1.8 micron layer of the electron beam resist and dried at 21°C. for 96 hours under nitrogen. Exposures were produced by scanning an electron beam transverse to the grooves, using a 4 micron scan excursion, while the disc was rotated under the beam. The beam was turned on and off at a rate so as to produce a series of exposures at a 50% duty cycle which had wavelengths of 1.6 and 0.9 microns along the groove. The nominal exposure used was $4.4 \times 10^{-6}$ coulombs/cm$^2$.

The exposed disc was developed as follows: the disc was submerged stepwise into AZ 1350 developer diluted 1/9 with water at 21°C. in six steps, at intervals of 1, 1, 0.5, 0.5 and 1.25 minutes. Thus the total development in each zone was 4.75, 3.75, 2.75, 2.25, 1.75 and 1.25 minutes respectively.

Figure 4:
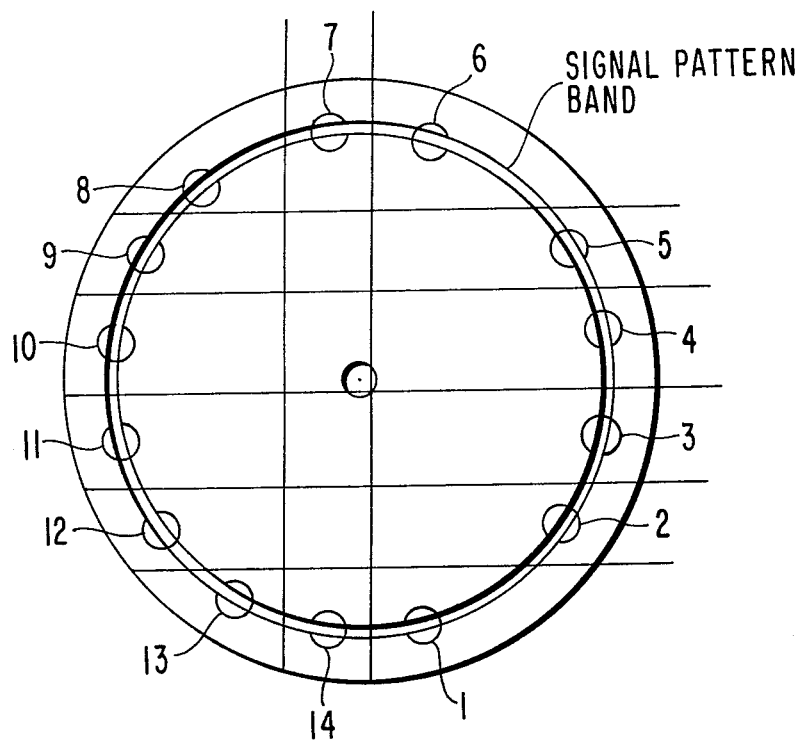
FIG. 4 represents a developed disc with 14 zones, each with a different development history.

The disc was then washed in a stream of distilled water, spin dried and after turning 90°, half of the disc was again submerged stepwise in the developer for 1 minute and the whole disc submerged for 1.5 minutes. The disc was washed with water after each immersion. FIG. 4 shows the resulting developed zones and development history graphically, wherein the numbers 1-14 refer to the sample Nos. 1-14 below.

A 150 micron thick negative metal replica of the disc was produced according to the process disclosed in copending application of Nosker et al., Ser. No. 408,751, filed Oct. 23, 1973, now U.S. Pat. No. 3,904,488. Samples 1-14 were punched from the metal replica and their profiles in a direction perpendicular to the groove were measured at an angle of about 88°C. using a scanning electron microscope. The widths and depths of the trenches (at 0.9 micron) for each development time are given below:

| Sample | Development time, min. | Trench width, microns | Trench depth, ++microns |
|---|---|---|---|
| 1 One Stage | 1.25 | —* | —* |
| 2 | 1.75 | 0.60 | .08 |

*-continued*

| Sample | Development time, min. | Trench width, microns | Trench depth, ++microns |
|---|---|---|---|
| 3 | 2.25 | 0.65 | .10 |
| 4 | 2.75 | 0.675 | .16 |
| 5 | 3.75 | 0.75 | .28 |
| 6 | 4.75 | | .20 |
| 7 Two Stage | 4.75+1.5 = 6.25 | — | |
| 8 | 4.75+2.5 = 7.25 | — | |
| 9 | 3.75+2.5 = 6.25 | — | |
| 10 | 2.75+2.5 = 5.25 | — | .6 |
| 11 | 2.25+2.5 = 4.75 | 0.55 | 0.3 |
| 12 | 1.75+2.5 = 4.25 | 0.55 | .18 |
| 13 | 1.25+2.5 = 3.75 | | .05 |
| 14 | 1.25+1.5 = 2.75 | — | |

*not measurable

Figure 5:
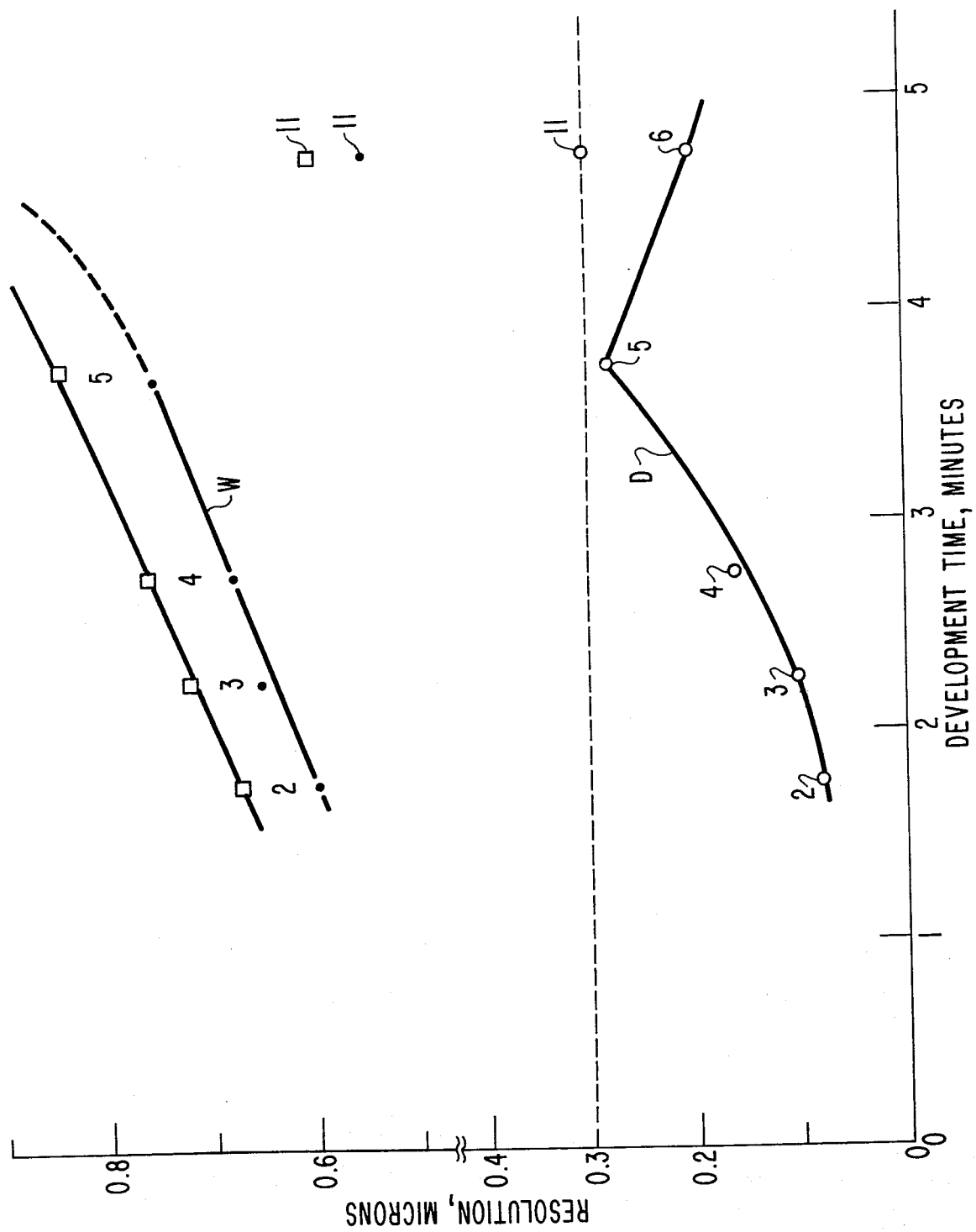
FIG. 5 is a graph of resolution as a function of development conditions.

FIG. 5 is a graph of the resolution obtained for samples 2-5 and 11 and of the depth and width of samples 2-6 and 11 as a function of development time in minutes at 0.9 micron recording wavelength. Sample 11, developed by the two-stage process, had a resolution of 0.6 and a depth of 0.3 micron. None of the single stage relief patterns had a depth $\geq$ 0.3 micron. The curve D shows the relationship of depth with development time of a single stage process and curve W shows a variation in width with development time for samples 2-5.

Figure 6:
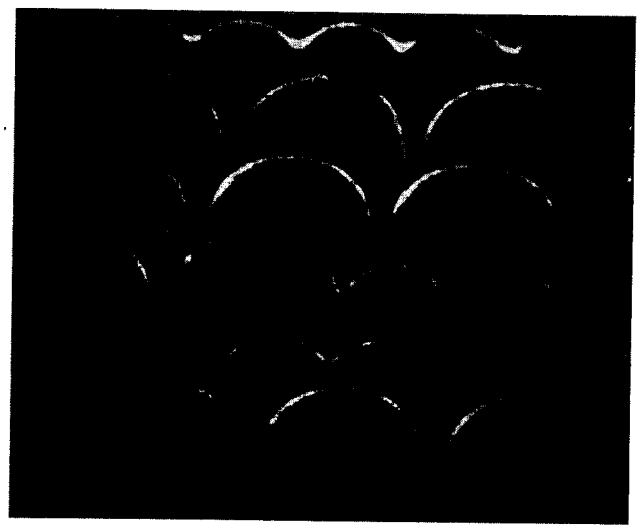
FIG. 6 is a photomicrograph of an exposed photoresist pattern developed in a known one-stage process.
Figure 7:
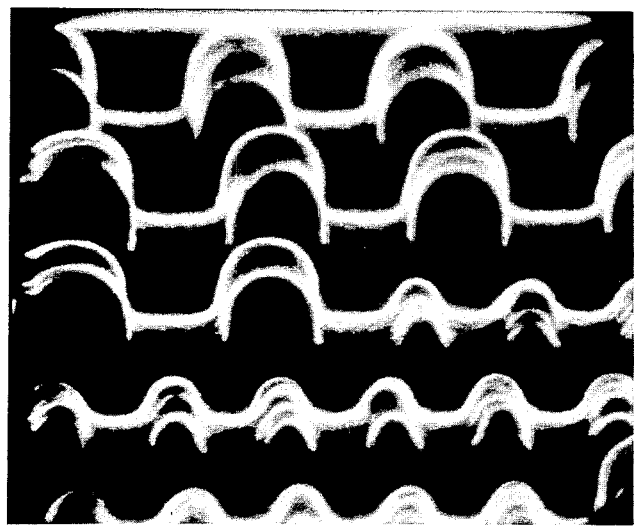
FIG. 7 is a photomicrograph of an exposed photoresist pattern developed in a novel two-stage process.

The improved resolution afforded by the novel two-stage development process is also illustrated by FIGS. 6 and 7. FIG. 6 is a photoprint of an electron micrograph of sample 6, single stage developed for 4.75 minutes and FIG. 7 is a photoprint of an electro micrograph of sample 11, also developed for 4.75 minutes, but in two steps.

I claim:

1. A process for developing a supported electron beam sensitive resist film which has been exposed to a modulated electron beam, said resist film comprising an admixture of a naphthoquinone (1,2-)diazide sulfonic acid ester and an alkali soluble resin to form a surface relief pattern which consists essentially of
   a. contacting the exposed resist film with an aqueous alkaline developer solution to form only a partially developed relief pattern,
   b. washing the partially developed resist film with water,
   c. drying to remove the water, and
   d. contacting the partially developed and washed resist film with the developer solution for sufficient time to increase the effective sensitivity of said film which thereby improves the resolution of said pattern as compared to a single development step.

2. A process according to claim 1 wherein the resist film comprises a mixture containing from about 1 to about 50% by weight of 2,4-bis(6-diazo-5,6-dihydro-5-oxo-1-naphthalenesulfonyloxy)benzophenone and from about 99 to about 50% by weight of an alkali soluble resin.

* * * * *